US011060990B2

(12) United States Patent
Hirota et al.

(10) Patent No.: US 11,060,990 B2
(45) Date of Patent: Jul. 13, 2021

(54) SEMICONDUCTOR MEASUREMENT DEVICE AND METHOD OF MEASURING SEMICONDUCTOR

(71) Applicant: TOSHIBA MEMORY CORPORATION, Tokyo (JP)

(72) Inventors: Jun Hirota, Yokohama Kanagawa (JP); Tsukasa Nakai, Hino Tokyo (JP); Masako Kobayashi, Kawasaki Kanagawa (JP); Kazunori Harada, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 170 days.

(21) Appl. No.: 16/113,979

(22) Filed: Aug. 27, 2018

(65) Prior Publication Data

US 2019/0293586 A1 Sep. 26, 2019

(30) Foreign Application Priority Data

Mar. 22, 2018 (JP) .............................. JP2018-055035

(51) Int. Cl.
*G01N 27/04* (2006.01)
*G01R 31/26* (2020.01)

(52) U.S. Cl.
CPC ....... *G01N 27/041* (2013.01); *G01R 31/2601* (2013.01)

(58) Field of Classification Search
CPC ...... G01N 27/04; G01N 27/041; G01R 27/02; G01R 27/08; G01R 31/26; G01R 31/2601;

(Continued)

(56) References Cited

U.S. PATENT DOCUMENTS 6,185,991 B1 * 2/2001 Hong ...................... B82Y 35/00
250/307
6,614,243 B2 * 9/2003 Klehn ................ G01R 1/06738
324/754.21

(Continued)

FOREIGN PATENT DOCUMENTS

JP H11-174067 A 7/1999
JP 2003-57163 A 2/2003

(Continued)

*Primary Examiner* — Son T Le
(74) *Attorney, Agent, or Firm* — Foley & Lardner LLP

(57) ABSTRACT

A semiconductor measurement device includes an electrode provided in a semiconductor sample, and a probe contactable with the semiconductor sample. A driver moves a contact position of the probe with respect to the semiconductor sample. A power supply applies electric power between the probe and the electrode. A measurement operation portion measures a current flowing via the semiconductor sample between the probe and the electrode as a voltage applied between the probe and the electrode is changed, the measurement operation portion measuring the current flowing for each of plural measurement points of a surface of the semiconductor sample while causing the probe to scan the measurement points, or while sequentially bringing the probe into contact with the measurement points. A display displays a relationship between the voltage and the current measured at each of the measurement points.

17 Claims, 9 Drawing Sheets

(58) Field of Classification Search
CPC ...... G01R 1/06; G01R 1/067; G01R 1/06705; G01R 1/06711; G01R 1/06744
See application file for complete search history.

(56) References Cited

U.S. PATENT DOCUMENTS

| | | |
|---|---|---|
| 9,410,983 B2 | 8/2016 | Shinomiya et al. |
| 2009/0206855 A1* | 8/2009 | Yasutake ................ G01R 27/02 324/716 |
| 2010/0176824 A1* | 7/2010 | Makihara ........... G01R 27/2617 324/690 |
| 2016/0290945 A1* | 10/2016 | Watanabe .............. G01N 17/00 |

FOREIGN PATENT DOCUMENTS

| | | |
|---|---|---|
| JP | 2008-002952 A | 1/2008 |
| JP | 4361405 B2 | 11/2009 |

* cited by examiner

Voltage (V)

Voltage (V)

Voltage (V)

SEMICONDUCTOR MEASUREMENT DEVICE AND METHOD OF MEASURING SEMICONDUCTOR

CROSS-REFERENCE TO RELATED APPLICATIONS

This application is based upon and claims the benefit of priority from Japanese Patent Application No. 2018-055035, filed Mar. 22, 2018, the entire contents of which are incorporated herein by reference.

FIELD

Embodiments described herein relate generally to a semiconductor measurement device and a method of measuring a semiconductor.

BACKGROUND

Recently, performance improvement and size reduction of a semiconductor device have progressed. Further, a semiconductor memory including a three-dimensional memory cell array, for example, an Electrically Erasable Programmable Read-Only Memory (NAND EEPROM) has also been developed. This semiconductor device is small-sized and complex, and thus a structure and a material thereof are diversified. Along with the development of the semiconductor device, a profile design of an impurity layer of the semiconductor device is important. Therefore, it is required to measure a structure of the impurity layer with high accuracy and high resolution. Examples of a method of measuring carrier concentration in an impurity layer include a Scanning Spreading Resistance Microscope (SSRM). The SSRM measures a spreading resistance of a sample of a semiconductor device and detects carrier concentration based on the resistance value. However, the SSRM can measure carrier concentration of an impurity layer, but has a problem in that it is not possible to detect a conductivity type of an impurity layer or a position of a p-n junction.

An example of related art includes JP-A-2008-002952.

DETAILED DESCRIPTION

Figure 1:
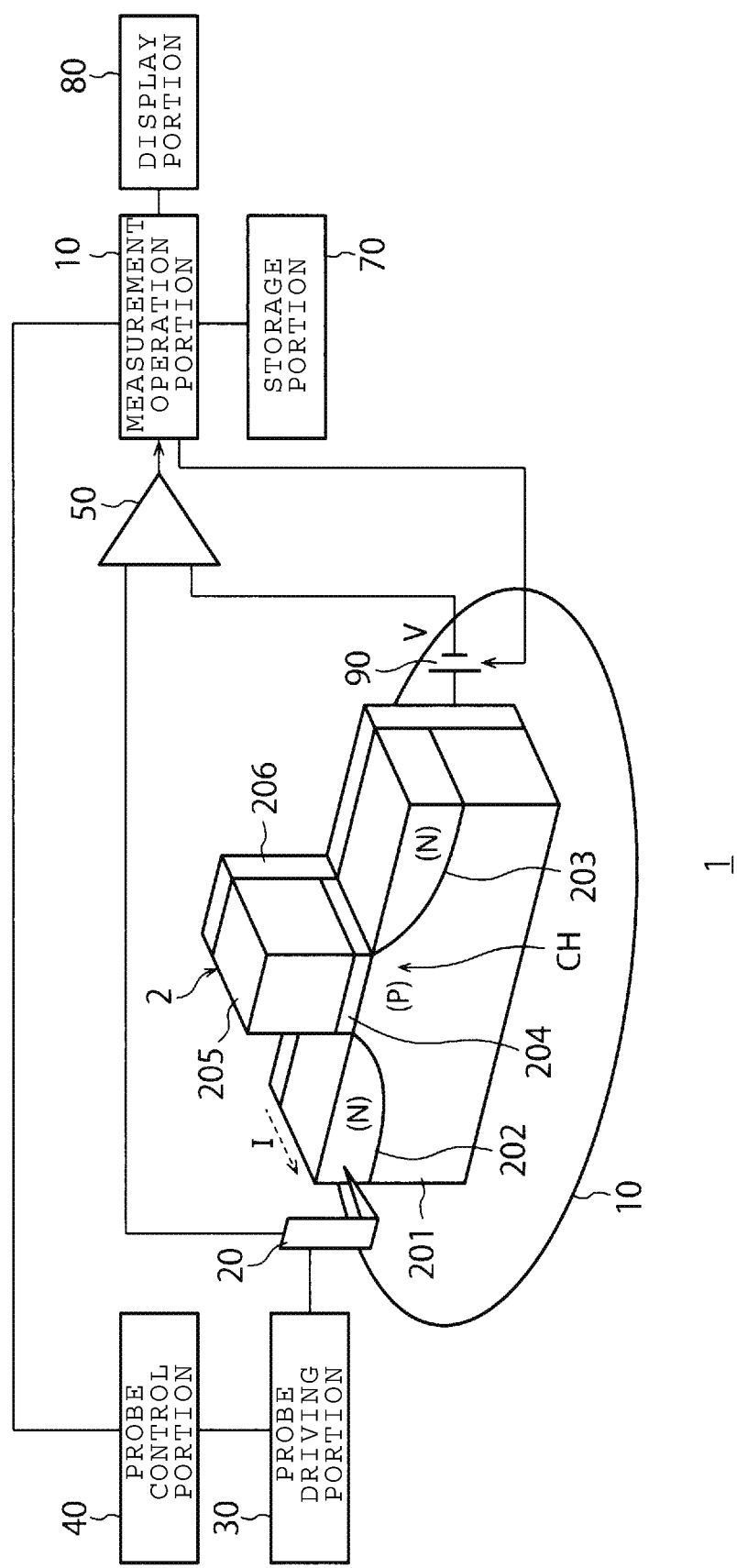
FIG. 1 is a schematic diagram showing a configuration example of a probe microscope device according to a first embodiment.

Embodiments provide a semiconductor measurement device and a method of measuring a semiconductor, in which a conductivity type of an impurity layer and a position of a p-n junction can be detected.

In general, according to one embodiment, there is provided a semiconductor measurement device including: an electrode provided in a semiconductor sample; and a probe contactable with the semiconductor sample. A driving portion (driver) is configured to move a contact position of the probe with respect to the semiconductor sample. A power supply is configured to apply electric power between the probe and the electrode. A measurement operation portion is configured to measure a current flowing via the semiconductor sample between the probe and the electrode as a voltage is applied between the probe and the electrode is changed, the measurement operation portion is configured to measure the current flowing for each of plural measurement points of a surface of the semiconductor sample while causing the probe to scan the measurement points, or while sequentially bringing the probe into contact with the measurement points. A display portion (display) displays a relationship between the voltage and the current measured at each of the measurement points.

Hereinafter, embodiments of the present disclosure will be described with reference to the drawings. The present disclosure is not limited to the embodiments. The drawings are schematic or conceptual, in which a ratio between components, and the like are not necessarily the same as the actual ones. In this specification and the drawings, the same components as described above with reference to the previous drawings are represented by the same reference numerals, and the detailed description thereof will not be repeated.

First Embodiment

FIG. 1 is a schematic diagram showing a configuration example of a probe microscope device 1 according to a first embodiment. The probe microscope device (hereinafter, also referred to as "device") 1 includes a stage 10, a probe 20, a probe driving portion 30, a probe control portion 40, an amplifier 50, a measurement operation portion 60, a storage portion 70, a display portion 80, and a power supply 90. The device 1 according to some embodiments is a semiconductor measurement device that brings the probe 20 into contact with a surface of a sample 2 to measure characteristics (I-V characteristics) of current and voltage such that a conductivity type (p-type or n-type) of the sample 2 and a position of the p-n junction portion can be determined based on the I-V characteristics.

The stage 10 can be equipped with the sample 2 and can fix the sample 2 to a given position. The sample 2 is, for example, a fine semiconductor sample that is cut from a semiconductor substrate or a semiconductor chip using Focused Ion Beam (FIB), ion milling, or the like. FIG. 1 shows a single Metal Insulator Semiconductor Field Effect Transistor (MISFET) as an example of the sample 2. In this case, the sample 2 includes a substrate 201, impurity layers 202 and 203, a gate insulating film 204, a gate electrode 205, and a sample electrode 206. The substrate 201 may be, for example, a semiconductor substrate formed of silicon, GaN, SiGe, or the like. The substrate 201 may be, for example, a p-type semiconductor substrate or a p-type well layer. The impurity layers 202 and 203 are provided in a surface region of the substrate 201, and include a p-type impurity and an n-type impurity. The p-type impurity may be, for example, boron. The n-type impurity may be, for example, phosphorus or arsenic. The gate insulating film 204 is provided on a channel portion CH between the impurity layer 202 and the impurity layer 203. The gate electrode 205 is provided on the gate insulating film 204. The sample electrode 206 is provided on one side surface of the sample 2. The sample electrode 206 is used for measuring the sample 2. The sample electrode 206 is, for example, a conductive metal such as copper and is deposited on the sample 2 by sputtering or the like after cutting the sample 2. A probe contact surface with which the probe 20 comes into contact is a side surface opposite to a side surface where the sample electrode 206 is provided.

Figure 2A:
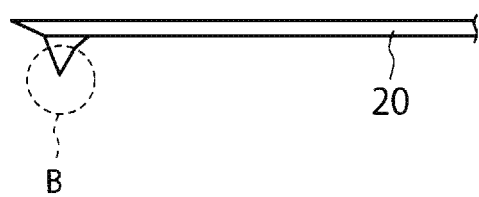
FIG. 2A is a side view showing an example of a probe.
Figure 2B:
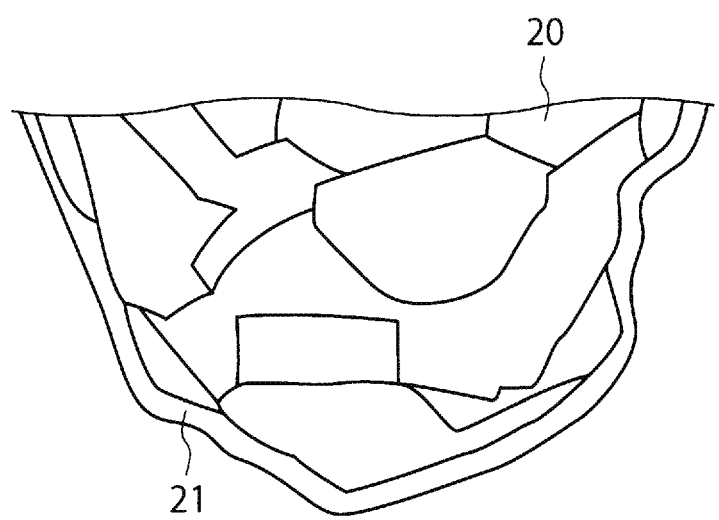
FIG. 2B is an enlarged view showing a tip portion of the probe.

The probe 20 is, for example, a probe in which a surface of polysilicon is covered with a boron-doped Diamond-Like Carbon (DLC), and is hard and conductive. FIG. 2A is a side view showing an example of the probe 20. FIG. 2B is an enlarged view showing a tip portion of the probe 20 indicated by a broken line circle B of FIG. 2A. The tip portion of the probe 20 has a width of, for example, several nanometers to several tens of nanometers, and is extremely sharp. By including the hard and sharp tip portion, the probe 20 can come into contact with a region within 10 nm or less from the sample 2. As a result, the resolution of the probe 20 is improved, and a nanoscale region can be measured. In addition, the resolution is high, and thus a position of a p-n junction portion can be accurately detected by using the device 1.

In addition, at least the tip portion of the probe 20 according to the embodiment is covered with an insulating film 21. As the insulating film 21, for example, a silicon oxide film, a silicon nitride film, or an intrinsic semiconductor material is used. As the intrinsic semiconductor material, for example, silicon, SiC, undoped diamond, or sapphire is used. The insulating film 21 is deposited on the tip portion of the probe 20, for example, using a Chemical Vapor Deposition (CVD) method, an Atomic Layer Deposition (ALD) method, a sputtering method, or coating. The insulating film 21 has a thickness of, for example, about 10 nm or less.

This way, the tip portion of the probe 20 is hard and sharp and is covered with the insulating film 21. Accordingly, by pressing the probe 20 to the sample 2 with a given force, the insulating film 21 is removed from the tip portion of probe 20, and at least a part of the tip portion of the probe 20 comes into direct or electric contact with the sample 2. On the other hand, in a region of the tip portion of the probe 20 other than the region where the probe 20 and the tip portion 2 are in direct contact with each other, the insulating film 21 is interposed between the probe 20 and the sample 2. That is, by covering the probe 20 with the insulating film 21, the tip portion of the probe 20 is in contact with the sample 2 via the insulating film 21, and a part of the tip portion of the probe is in direct contact with the sample 2. Hereinafter, the region where the probe 20 and the sample 2 are in direct contact with each other will be called "direct contact region". The region where the probe 20 and the sample 2 are in contact with each other with the insulating film 21 interposed therebetween will be called "indirect contact region". In order to form the direct contact region and the indirect contact region when the probe 20 is brought into contact with the sample 2, it is necessary to adjust the thickness of the insulating film 21 or the press force with which the probe 20 is pressed to the sample 2. For example, in a case where the press force is relatively weak, the thickness of the insulating film 21 is adjusted to be small. In a case where the press force is relatively strong, the thickness of the insulating film 21 is adjusted to be large. As a result, the tip portion of the probe 20 is partially in contact with the sample 2 such that both the direct contact region and the indirect contact region are formed between the probe 20 and the sample 2. The reason why the tip portion of the probe 20 is partially brought into contact with the sample 2 will be described below with reference to FIG. 3.

Returning to FIG. 1, the probe driving portion 30 operates the probe 20 so as to bring the probe 20 into contact with the sample 2 and press the probe 20, or to move a contact position of the probe 20 relative to the sample 2.

The probe control portion 40 controls the probe driving portion 30 such that the probe 20 is moved to a desired position of the sample 2 and presses the sample 2 with a desired press force. The contact position of the sample 2 and the press force may be stored in the storage portion 70 in advance.

The probe driving portion 30 and the probe control portion 40 cause the probe 20 to continuously scan a surface of the sample 2 such that the probe 20 comes into contact with plural measurement points of the surface of the sample 2. Alternatively, the probe driving portion 30 and the probe control portion 40 may cause the probe 20 to be repeatedly pressed to and separated from each of the measurement points such that the probe 20 comes into contact with the measurement points discretely sequentially. In a case where the probe 20 is caused to continuously scan the surface of the sample 2, residues may be formed by the sample 2 being cut, or a structure in the vicinity of the measurement point may be uneven. In addition, the probe 20 may be worn. Accordingly, when the probe 20 is sequentially brought into contact with the measurement points, it is preferable that the probe driving portion 30 and the probe control portion 40 cause the probe 20 to be pressed to each of the measurement points and then cause the probe 20 to be separated from the measurement point such that the probe 20 comes into contact with the sample 2 discretely.

Two inputs of the amplifier 50 are connected to the probe 20 and the power supply 90, respectively, and an output of the amplifier 50 is connected to the measurement operation portion 60. The amplifier 50 amplifies a current value flowing via the sample 2 and outputs the amplified current value to the measurement operation portion 60.

The measurement operation portion 60 measures a current flowing between the probe 20 and the sample electrode 206 at each of the measurement points of the surface of the sample 2 while causing the probe 20 to scan the measurement points or while sequentially bringing the probe 20 into contact with the measurement points. At this time, the measurement operation portion 60 changes a voltage value applied to the sample 2 between the probe 20 and the sample electrode 206. Since the voltage value is changed, the measurement operation portion 60 can change a voltage value of the power supply 90. As a result, when the probe 20 is in contact with a given measurement point of the sample 2, the measurement operation portion 60 can measure a current flowing via the sample 2 while changing the voltage value applied to the sample 2.

The measurement operation portion 60 stores a coordinate of a measurement point, a voltage value applied to the sample 2, and a current value measured at the measurement point in the storage portion 70 in association with one another. In addition, the measurement operation portion 60 displays a relationship between the voltage value and the current value on the display portion 80 as a graph of the I-V characteristics.

The measurement operation portion 60 is configured to control the components of the device 1. The measurement operation portion 60 may be formed of, for example, CPU or a program, or may be formed of a logic circuit such as a Programmable Logic Controller (PLC).

The storage portion 70 stores the voltage value or the current value measured by the measurement operation portion 60, the voltage value of the power supply 90, the contact position of the probe 20, the press force of the probe 20, the program for operating the device 1, and the like.

The display portion 80 can display the graph of the I-V characteristics obtained as a result of the measurement. The display portion 80 may display a graph of I-V characteristics per contact position of the probe 20, that is, per measurement point.

The power supply 90 is connected between the sample electrode 206 and one input of the amplifier 50, and applies electric power between the probe 20 and the sample electrode 206. The power supply 90 may be any one of a DC power supply or an AC power supply. In a case where the power supply 90 is a DC power supply, the measurement operation portion 60 periodically changes the voltage of the power supply 90 in order to change the voltage V applied to the sample 2. In a case where the power supply 90 is an AC power supply, the measurement operation portion 60 may perform the measurement of the current I according to a voltage frequency of the AC power supply. An AC power supply voltage is changed at a higher frequency than a DC power supply voltage. Therefore, by using the AC power supply, the measurement time may be reduced.

Figure 3:
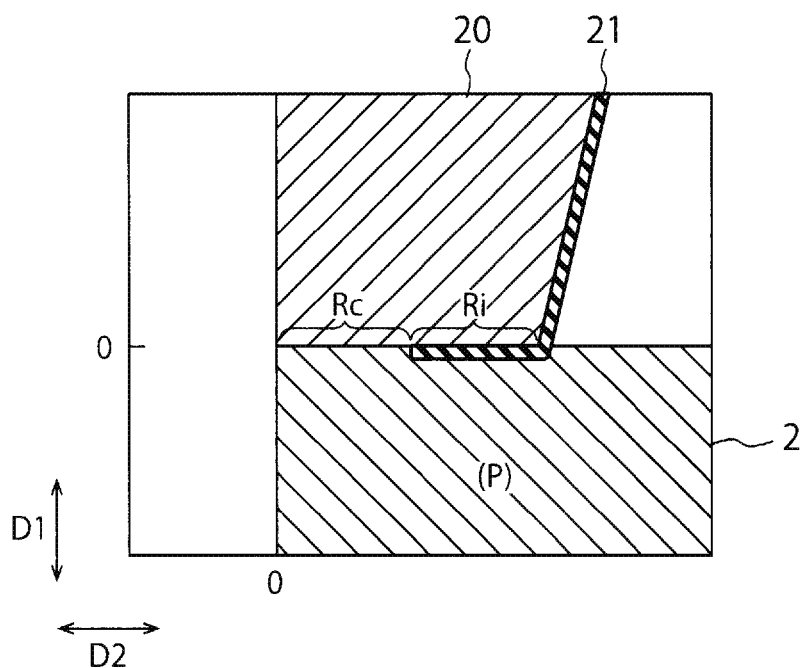
FIG. 3 is a schematic cross-sectional view showing a contact portion between the probe and a sample.

FIG. 3 is a schematic cross-sectional view showing a contact portion between the probe 20 and the sample 2. In FIG. 3, the vertical axis represents the distance of the probe 20 from the sample 2 in a pressing direction. An origin point 0 of the vertical axis represents a contact position between the probe 20 and the sample 2. In FIG. 3, the horizontal axis represents the distance in a direction perpendicular to the pressing direction. An origin point 0 of the horizontal axis represents the center of the tip portion of the probe 20. Accordingly, FIG. 3 shows half of the tip portion of the probe 20, and does not show the other half.

The direct contact region where the probe 20 and the sample 2 are electrically connected is represented by Rc. The indirect contact region where the insulating film 21 is interposed between the probe 20 and the sample 2 such that the probe 20 and the sample 2 are electrically insulated from each other is represented by Ri. In some embodiments, when the probe 20 is brought into contact with the sample 2, as illustrated in FIG. 3, the tip portion of the probe 20 includes both the direct contact region Rc and the indirect contact region Ri and is partially in electric contact with the sample 2.

Figure 4:
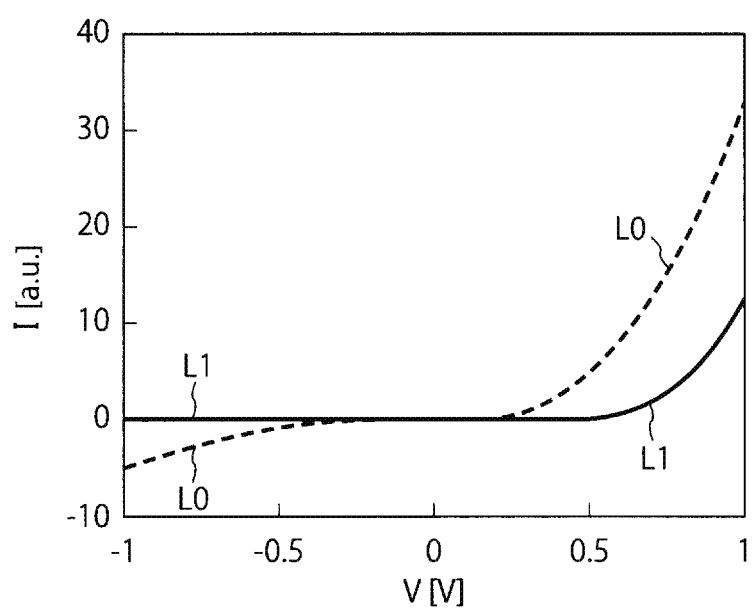
FIG. 4 is a graph showing I-V characteristics measured by a measurement operation portion.

FIG. 4 is a graph showing the I-V characteristics measured by the measurement operation portion 60. The horizontal axis represents the voltage V applied to the sample 2 between the probe 20 and the sample electrode 206. The vertical axis represents the current I flowing via the sample 2 between the probe 20 and the sample electrode 206. The voltage V shows a voltage of the sample electrode 206 relative to a voltage of the probe 20 (voltage difference).

Regarding the current I, a current flowing from the sample electrode 206 to the probe 20 via the sample 2 is set as a positive current.

A line L0 represents the measurement results using a probe not including the insulating film 21. A line L1 represents the measurement results using the probe 20 according to some embodiments.

Here, in a case where the probe not including the insulating film 21 is used, a tip portion of the probe comes into contact with the sample 2 without the insulating film interposed therebetween. This contact is a pseudo-ohmic contact. That is, most of a contact region between the probe and the sample 2 is the direct contact region Rc. In this case, the probe is in pseudo-ohmic contact with the sample 2. Therefore, as indicated by the line L0, the current I flows irrespective of whether the voltage V between the probe and the sample electrode 206 is a positive voltage or a negative voltage.

On the other hand, according to some embodiments, as illustrated in FIG. 3, the tip portion of the probe 20 includes not only the direct contact region Rc where the probe 20 is in electric contact with the sample 2 but also the indirect contact region Ri where the probe 20 is in contact with the sample 2 with the insulating film 21 interposed therebetween. Accordingly, the probe 20 is in pseudo-ohmic contact with the sample 2 in the direct contact region Rc, but has the same structure as a MISFET in the indirect contact region Ri.

In some embodiments, when the voltage V is applied, a depletion layer or a charge storage layer may be formed in the sample 2 immediately below the indirect contact region Ri. For example, in a case where the sample 2 immediately below the indirect contact region Ri is a p-type semiconductor, when the voltage V of the sample electrode 206 is high in the positive direction (that is, the voltage of the probe 20 is high in the negative direction), a charge storage layer is formed immediately below the indirect contact region Ri. Even in a case where the charge storage layer is formed immediately below the indirect contact region Ri, the flow of the current I in the direct contact region Rc is not interrupted. Therefore, the current I flows from the sample electrode 206 to the probe 20. Accordingly, as indicated by the line L1 of FIG. 4, in a case where the voltage V is high in the positive direction, the current I increases. On the other hand, when the voltage V of the sample electrode 206 is high in the negative direction (that is, the voltage of the probe 20 is high in the positive direction), a depletion layer is formed immediately below the indirect contact region Ri. The depletion layer expands immediately below the indirect contact region Ri in a vertical axis direction D1 and also expands toward the direct contact region Rc in a horizontal axis direction D2. Accordingly, the direct contact region Rc is narrowed by the depletion layer, and the current I is less likely to flow. In a case where the depletion layer spreads over the entire area of the direct contact region Rc, the current I does not substantially flow. Accordingly, as indicated by the line L1 of FIG. 4, in a case where the voltage V is high in the negative direction, the current I does not substantially flow.

Although not illustrated in the drawing, in a case where the sample 2 immediately below the indirect contact region Ri is an n-type semiconductor, when the voltage V of the sample electrode 206 is high in the positive direction (that is, the voltage of the probe 20 is high in the negative direction), a depletion layer is formed immediately below the indirect contact region Ri. The depletion layer expands immediately below the indirect contact region Ri in a vertical axis direction D1 and also expands toward the direct contact region Rc in a horizontal axis direction D2. In a case where the depletion layer spreads over the entire area of the direct contact region Rc, the current I does not substantially flow. On the other hand, when the voltage V of the sample electrode 206 is high in the negative direction (that is, the voltage of the probe 20 is high in the positive direction), a charge storage layer is formed immediately below the indirect contact region Ri. Even in a case where the charge storage layer is formed immediately below the indirect contact region Ri, the flow of the current I in the direct contact region Rc is not interrupted. Accordingly, in a case where the voltage V is high in the positive direction, the current I increases.

By using the probe 20 according to some embodiments as described above, the following rectification characteristics are obtained: in a case where the voltage V has straight polarity, the current I flows; and in a case where the voltage V has reverse polarity, the current I does not substantially flow. Further, a rectification direction of the rectification characteristics changes depending on the conductivity type of the sample 2 at the measurement point. The present inventors found that, by using the above-described rectification characteristics, the conductivity type of the sample 2 at the measurement point can be detected. Hereinafter, a method of detecting the conductivity type will be described.

Figure 5:
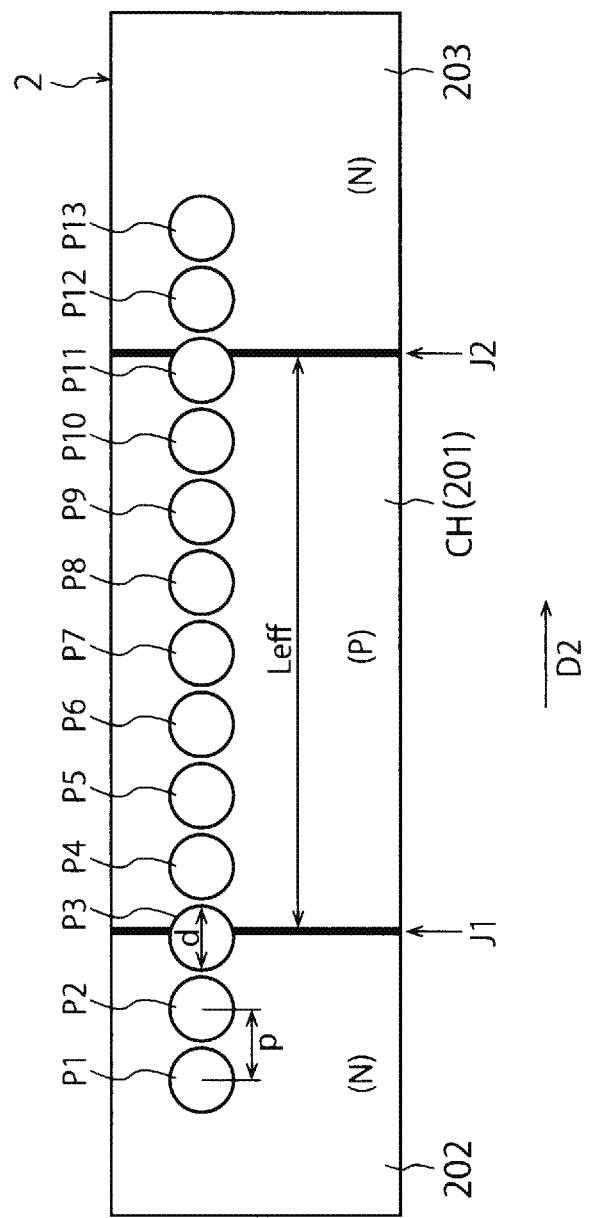
FIG. 5 is a schematic cross-sectional view showing junction portions and measurement points between impurity layers and a channel portion of the sample.

FIG. 5 is a schematic cross-sectional view showing junction portions and measurement points between the impurity layers 202 and 203 and the channel portion CH of the sample 2. In FIG. 5, for example, the impurity layers 202 and 203 are n-type semiconductors, and the channel portion CH is a p-type semiconductor as in the case of the substrate 201. That is, here, the sample 2 is an n-type MISFET. A p-n junction portion J1 is present between the impurity layer 202 and the channel portion CH, and a p-n junction portion J2 is present between the impurity layer 203 and the channel portion CH. The distance between the p-n junction portions J1 and J2 is set as an effective channel length Leff.

The effective channel length Leff is an important parameter as a characteristic of a MISFET. In order to accurately measure the effective channel length Leff, it is necessary to accurately detect the positions of the p-n junction portions J1 and J2.

Circles P1 to P13 illustrated in FIG. 5 schematically show direct contact regions (regions where the probe 20 is in contact with the sample 2 without the insulating film 21 interposed therebetween) at the respective measurement points. An interval (pitch) between the centers of adjacent measurement points can be arbitrarily set. For example, by reducing the pitch of the measurement points, the resolution can be improved. Specifically, for example, the pitch of the measurement points may be set to be as small as possible to the extent that the direct contact regions of the respective measurement points do not overlap each other. For example, when the diameter of the direct contact region at each of the measurement points is represented by "d", the pitch "p" may be set to be "p≈d" while satisfying "p>d". Even in a case where the pitch of the measurement points is set such that the direct contact regions of the respective measurement points overlap each other, that is, the pitch of the measurement points is set so as to satisfy "p≤d", the measurement can be performed. Even in a case where the probe 20 is sequentially brought into contact with the measurement points P1 to P13, the device 1 can measure the I-V characteristics at each of the measurement points P1 to P13.

Figure 6A:
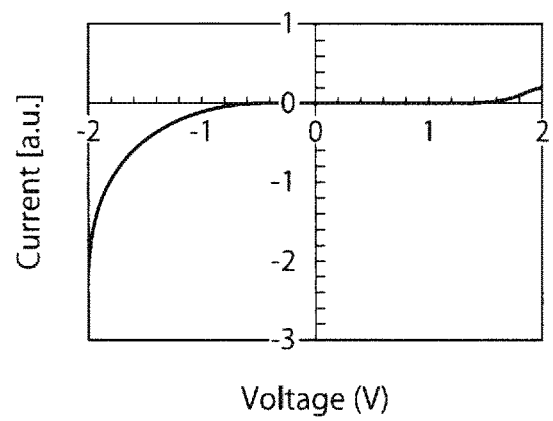
FIGS. 6A to 6C are graphs showing I-V characteristics obtained at the measurement points.
Figure 6B:
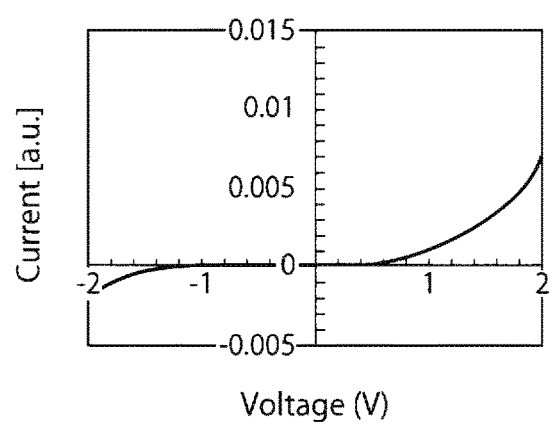
Figure 6C:
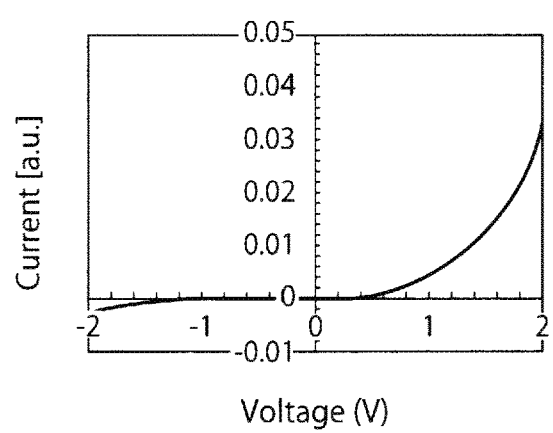

For example, FIGS. 6A to 6C are graphs showing I-V characteristics of the measurement points P2, P3, and P4, respectively. The measurement point P2 is a measurement point in the n-type impurity layer 202. Accordingly, as illustrated in FIG. 6A, when the voltage V is high in the negative direction, (that is, the voltage of the probe 20 is high in the positive direction), the current I increases in the negative direction. On the other hand, when the voltage V is high in the positive direction (that is, the voltage of the probe 20 is high in the negative direction), the current I does not substantially flow. An operator can recognize that the measurement point P2 is the n-type impurity layer 202 by referring to the I-V characteristics.

The measurement point P4 is a measurement point in the p-type channel portion CH. Accordingly, as illustrated in FIG. 6C, when the voltage V is high in the negative direction, (that is, the voltage of the probe 20 is high in the positive direction), the current I does not substantially flow. On the other hand, when the voltage V is high in the positive direction (that is, the voltage of the probe 20 is high in the negative direction), the current I increases in the positive direction. The operator can recognize that the measurement point P4 is the p-type impurity layer (the substrate 201 or a well layer) by referring to the I-V characteristics.

The measurement point P3 is a measurement point in the p-n junction portion J1. Accordingly, as illustrated in FIG. 6B, the current I is low in terms of an absolute value irrespective of the voltage V. It should be noted that the scale of the vertical axis of FIG. 6B is significantly smaller than those of FIGS. 6A and 6C.

By referring to the I-V characteristics of the measurement points P2 to P4, the operator can recognize that the conductivity type of the sample 2 changes from the n-type to the p-type over the region from the measurement point P2 to the measurement point P4 and that the p-n junction portion J1 is positioned at the measurement point P3.

Although not illustrated in the drawing, the I-V characteristics of the measurement points P10 to P12 correspond to the I-V characteristics of the measurement points P4, P3, and P2. Accordingly, as in the case of the p-n junction portion J1, by referring to the I-V characteristics of the measurement points P10 to P12, the operator can recognize that the conductivity type of the sample 2 changes from the p-type to the n-type over the region from the measurement point P10 to the measurement point P12 and that the p-n junction portion J2 is positioned at the measurement point P11.

Figure 7:
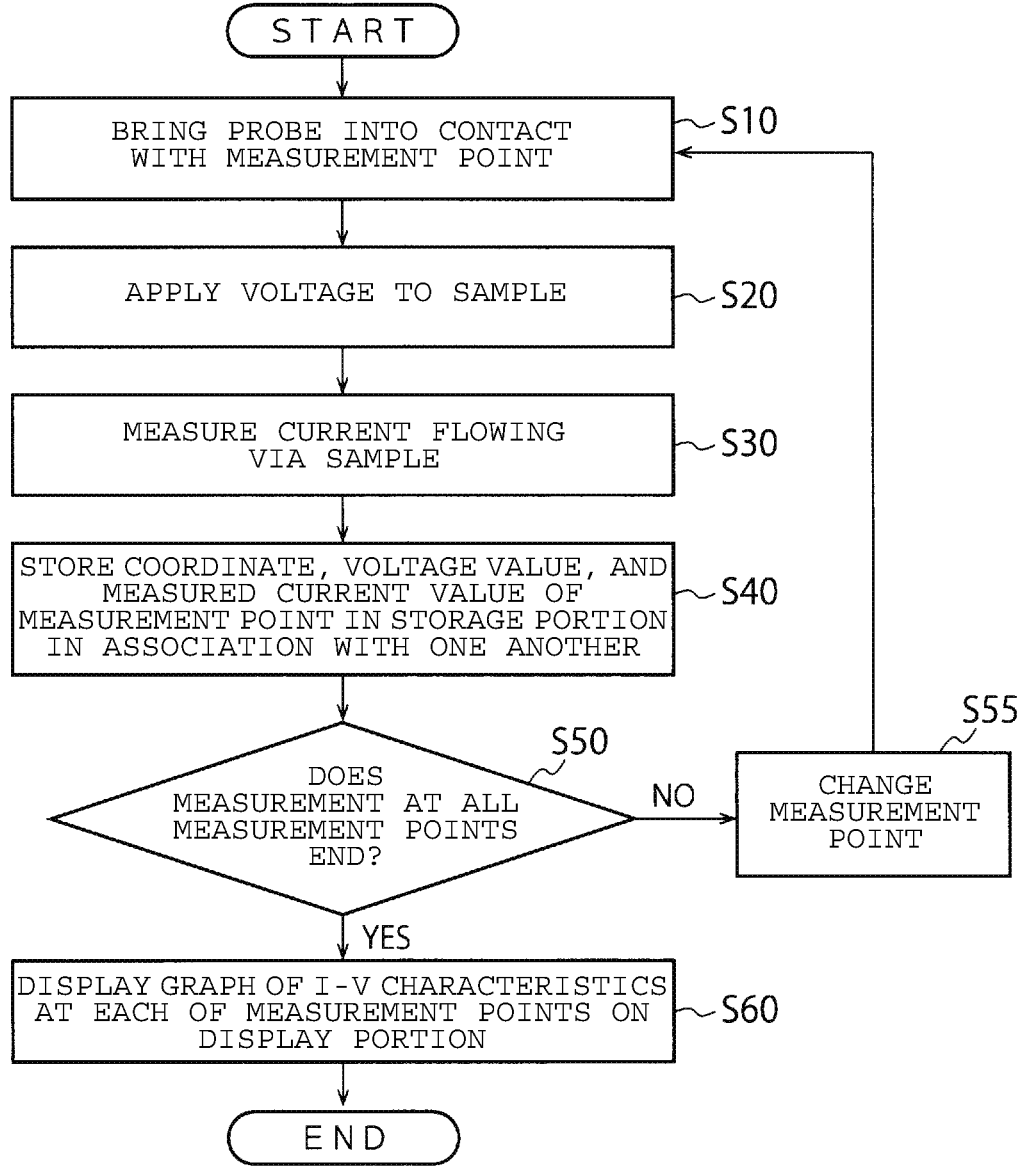
FIG. 7 is a flowchart showing an example of a method of measuring a conductivity type.

FIG. 7 is a flowchart showing an example of a method of measuring a conductivity type. In the following example, the device 1 performs the measurement while bringing the probe 20 into contact with the measurement points P1 to P13 discretely. Of course, the device 1 may cause the probe 20 to scan the sample 2 so as to pass through the measurement points P1 to P13 while bringing the probe 20 into contact with the sample 2.

First, the sample 2 is placed on the stage 10, and the probe driving portion 30 brings the probe 20 into contact with the measurement point P1 (S10). At this time, the probe driving portion 30 presses the probe 20 to the measurement point P1 with a predetermined force such that the tip portion of the probe 20 is partially in electric contact with the sample 2. As a result, the direct contact region Rc and the indirect contact region Ri are formed between the probe 20 and the sample 2.

Next, the power supply 90 applies a voltage to the sample 2 between the probe 20 and the sample electrode 206 (S20). The measurement operation portion 60 changes the voltage in a range of, for example, −2 V to +2 V. The measurement operation portion 60 measures a current flowing via the sample 2 between the probe 20 and the sample electrode 206 while changing the voltage applied to the sample 2 (S30).

Next, the measurement operation portion 60 stores a coordinate of the measurement point P1, the voltage value applied to the sample 2, and the current value measured at the measurement point P1 in the storage portion 70 in association with one another (S40).

Next, the measurement operation portion 60 performs Steps S10 to S40 using the above-described method while changing the measurement point among the measurement points P2 to P13 (NO in S50, S55).

In a case where the measurement of all the measurement points of the sample 2 ends (YES in S50), the measurement operation portion 60 displays a graph of the I-V characteristics at each of the measurement points on the display portion 80 (S60). The display portion 80 may display the graph in the order of the measurement points such that a correspondence between the position of each of the measurement points and the graph can be easily understood. The form of the graph displayed on the display portion 80 is not particularly limited.

By referring to the graph displayed on the display portion 80, the operator can determine the conductivity type of the sample 2 at each of the measurement points. In addition, the operator can determine the p-n junction portion or the effective channel length Leff based on the conductivity type of the sample 2 at each of the measurement points.

This way, according to the embodiment, the device 1 measures the I-V characteristics of the sample 2 and displays the measured I-V characteristics in a state where both the direct contact region Rc and the indirect contact region Ri are provided between the probe 20 and the sample 2. By referring to the I-V characteristics, the operator can easily determine the conductivity type of the sample 2 and the positions of the p-n junction portions J1 and J2 at the measurement points. In a case where the positions of the p-n junction portions J1 and J2 are determined, the effective channel length Leff is obtained based on the distance between the p-n junction portions J1 and J2. That is, in the embodiment, by setting the pitch of adjacent measurement points to be small, the effective channel length Leff can be accurately detected with a high resolution of, for example, 10 nm or less.

Second Embodiment

Figure 8:
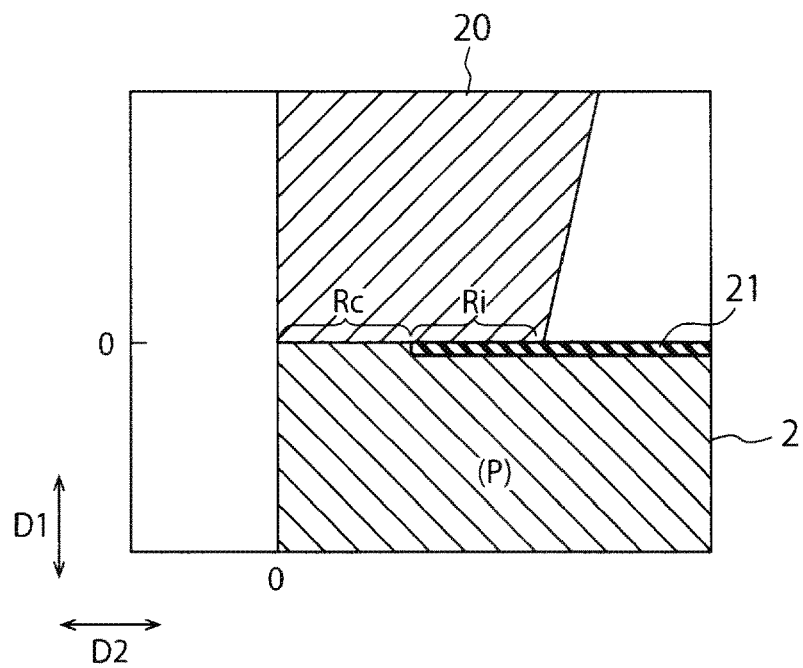
FIG. 8 is a schematic cross-sectional view showing a contact portion between a probe and a sample according to a second embodiment.

FIG. 8 is a schematic cross-sectional view showing a contact portion between the probe 20 and the sample 2 according to a second embodiment. In the second embodiment, the insulating film 21 is provided on the probe contact surface of the sample 2 and is not provided on the tip portion of the probe 20. The thickness of the insulating film 21 is, for example, about 10 nm or less. In this case, by pressing the probe 20 to the sample 2 with a given force, the insulating film 21 of the sample 2 is removed from the tip portion of probe 20, and at least a part of the tip portion of the probe 20 comes into direct or electric contact with the sample 2. On the other hand, the insulating film 21 remains between the other part of the tip portion of the probe 20 and the sample 2. Accordingly, as illustrated in FIG. 8, both the direct contact region Rc and the indirect contact region Ri are formed between the probe 20 and the sample 2. The other configurations and operations of the second embodiment are the same as the corresponding configurations and operations of the first embodiment. Accordingly the second embodiment can obtain the same effects as the first embodiment.

Third Embodiment

Figure 9:
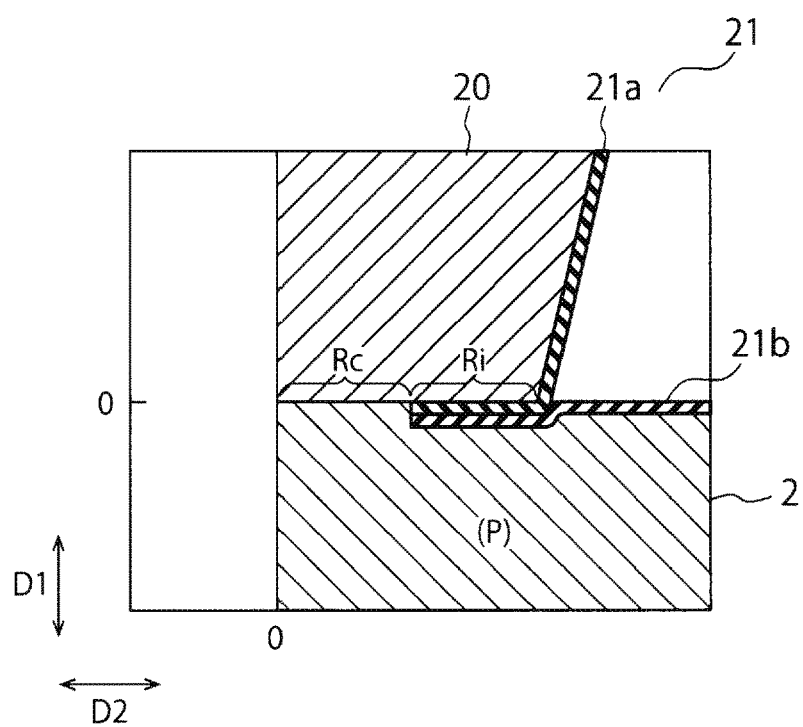
FIG. 9 is a schematic cross-sectional view showing a contact portion between a probe and a sample according to a third embodiment.

FIG. 9 is a schematic cross-sectional view showing a contact portion between the probe 20 and the sample 2 according to a third embodiment. In the third embodiment, the insulating film 21 is provided on both the tip portion of the probe 20 and the probe contact surface of the sample 2. The sum of the thickness of an insulating film 21a provided on the tip portion of the probe 20 and the thickness of an insulating film 21b provided on the probe contact surface of the sample 2 is, for example, about 10 nm or less. In this case, by pressing the probe 20 to the sample 2 with a given force, the insulating films 21a and 21b are removed from the tip portion of probe 20, and at least a part of the tip portion of the probe 20 comes into direct or electric contact with the sample 2. On the other hand, the insulating films 21a and 21b remain between the other part of the tip portion of the probe 20 and the sample 2. Accordingly, as illustrated in FIG. 9, both the direct contact region Rc and the indirect contact region Ri are formed between the probe 20 and the sample 2. The other configurations and operations of the third embodiment are the same as the corresponding configurations and operations of the first embodiment. Accordingly the third embodiment can obtain the same effects as the first embodiment.

As the insulating film 21, an insulating film formed of, for example, a silicon oxide film, a silicon nitride film, or an intrinsic semiconductor material is used. However, instead of or in addition to the insulating film 21, an inactive layer may be provided on the tip portion of the probe 20 and/or the probe contact surface of the sample 2. The inactive layer is a layer in which an impurity is inactivated, and is not conductive. Accordingly, the inactive layer can be used instead of the insulating film 21. The inactive layer may be formed by destroying surface crystals of the probe 20 or the sample 2, for example, using a FIB method or an ion milling method to inactivate an impurity.

Fourth Embodiment

In the first to third embodiments, the device 1 displays the I-V characteristics of the plural measurement points, and the operator determines the conductivity type of the sample 2, the p-n junction portion, and the effective channel length Leff by referring to the I-V characteristics. On the other hand, the device 1 according to the fourth embodiment automatically determines the conductivity type of the sample 2, the p-n junction portion, and the effective channel length Leff based on the I-V characteristics of the plural measurement points.

In order to automatically determine the conductivity type and the like, a first threshold current It1 and a second threshold current It2 of the current I having different polarities are stored in the storage portion 70.

Figure 10A:
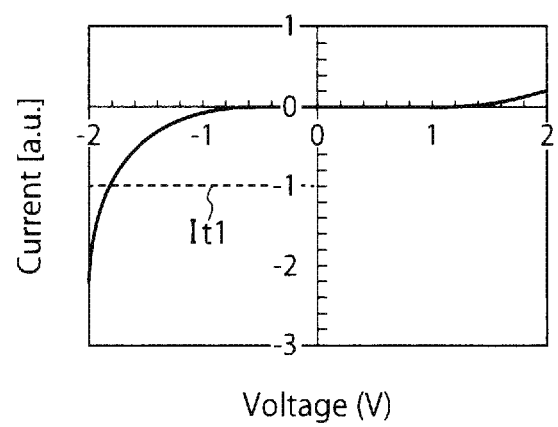
FIGS. 10A and 10B are graphs showing an example of a first threshold current and a second threshold current.
Figure 10B:
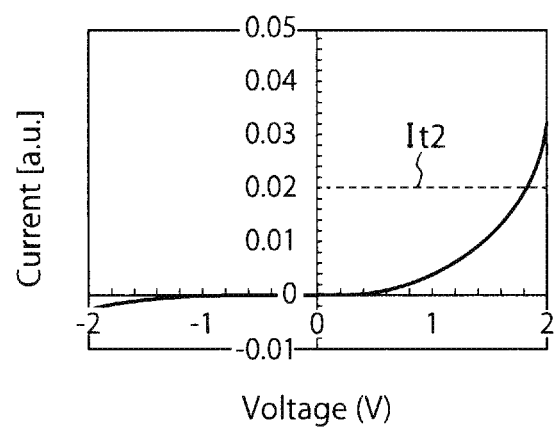

FIGS. 10A and 10B are graphs showing an example of the first threshold current It1 and the second threshold current It2. The graphs of FIGS. 10A and 10B basically correspond to the graphs of FIGS. 6A and 6C.

As illustrated in FIG. 10A, the first threshold current It1 is set as, for example, −1 for a negative electrode. When the voltage V is applied to the sample 2, in a case where the current I flowing via the sample 2 is lower than the first threshold current It1, the measurement operation portion 60 determines that the conductivity type of the sample 2 at the measurement point is n-type. For example, in FIG. 10A, when a negative voltage is applied to the sample 2, the current I increases to the negative electrode side and becomes lower than the first threshold current It1. This way, in a case where the current I is lower than the first threshold current It1, the device 1 determines this measurement point as an n-type semiconductor. The value of the first threshold current It1 can be set as a reference value for determining that the conductivity type of the sample 2 is n-type, and may be set as an appropriate value such that erroneous determination caused by variations of measured values can be prevented. Alternatively, for example, characteristics of an n-type portion of the sample 2 may be measured in advance, and a current value at which a change of the current value is the maximum relative to a change of the voltage value may be set as the first threshold current It1.

As illustrated in FIG. 10B, the second threshold current It2 is set as, for example, +0.02 for a positive electrode. When the voltage is applied to the sample 2, in a case where the current I flowing via the sample 2 is higher than the second threshold current It2, the measurement operation portion 60 determines that the conductivity type of the sample 2 at the measurement point is p-type. For example, in FIG. 10B, when a positive voltage is applied to the sample 2, the current I increases to the positive electrode side and becomes higher than the second threshold current It2. This way, in a case where the current I is higher than the second threshold current It2, the device 1 determines this measurement point as a p-type semiconductor. The value of the second threshold current It2 can be set as a reference value for determining that the conductivity type of the sample 2 is p-type, and may be set as an appropriate value such that erroneous determination caused by variations of measured values can be prevented. Alternatively, for example, characteristics of a p-type portion of the sample 2 may be measured in advance, and a current value at which a change of the current value is the maximum relative to a change of the voltage value may be set as the second threshold current It2.

As illustrated in FIG. 6B, even when a voltage is applied to the sample 2, in a case where the current I is lower than the first and second threshold currents It1 and It2 in terms of absolute values, the measurement operation portion 60 determines that a p-n junction portion is present at the measurement point. As a result, the device 1 can automatically detect the measurement point where the p-n junction portion is present. In FIG. 6B, the scale of the vertical axis is small, and thus the first and second threshold currents It1 and It2 are not displayed.

The first and second threshold currents It1 and It2 are appropriately adjusted by adjusting the structure of the probe 20, the structure of the sample 2, the thickness of the insulating film 21, the variation width of the voltage V, and the like.

In a case where plural p-n junctions are detected, the measurement operation portion 60 may calculate the distance between the p-n junction portions and may display the calculated distance on the display portion 80 as the effective channel length Leff. The distance between the p-n junction portions may be calculated from coordinates of measured values corresponding to the p-n junction portion, respectively. For example, the sample 2 includes one MISFET. Therefore, in a case where the p-n junction portions J1 and J2 illustrated in FIG. 5 are detected, the distance between the p-n junction portion J1 and the p-n junction portion J2 is the effective channel length Leff.

As illustrated in FIGS. 10A and 10B, the display portion 80 may display the first and second threshold currents It1 and It2 to be superimposed on the graph of the I-V characteristics. As a result, the operator can easily check that the determination of the device 1 on the conductivity type and the p-n junction portion at the measurement point is correct.

Figure 11:
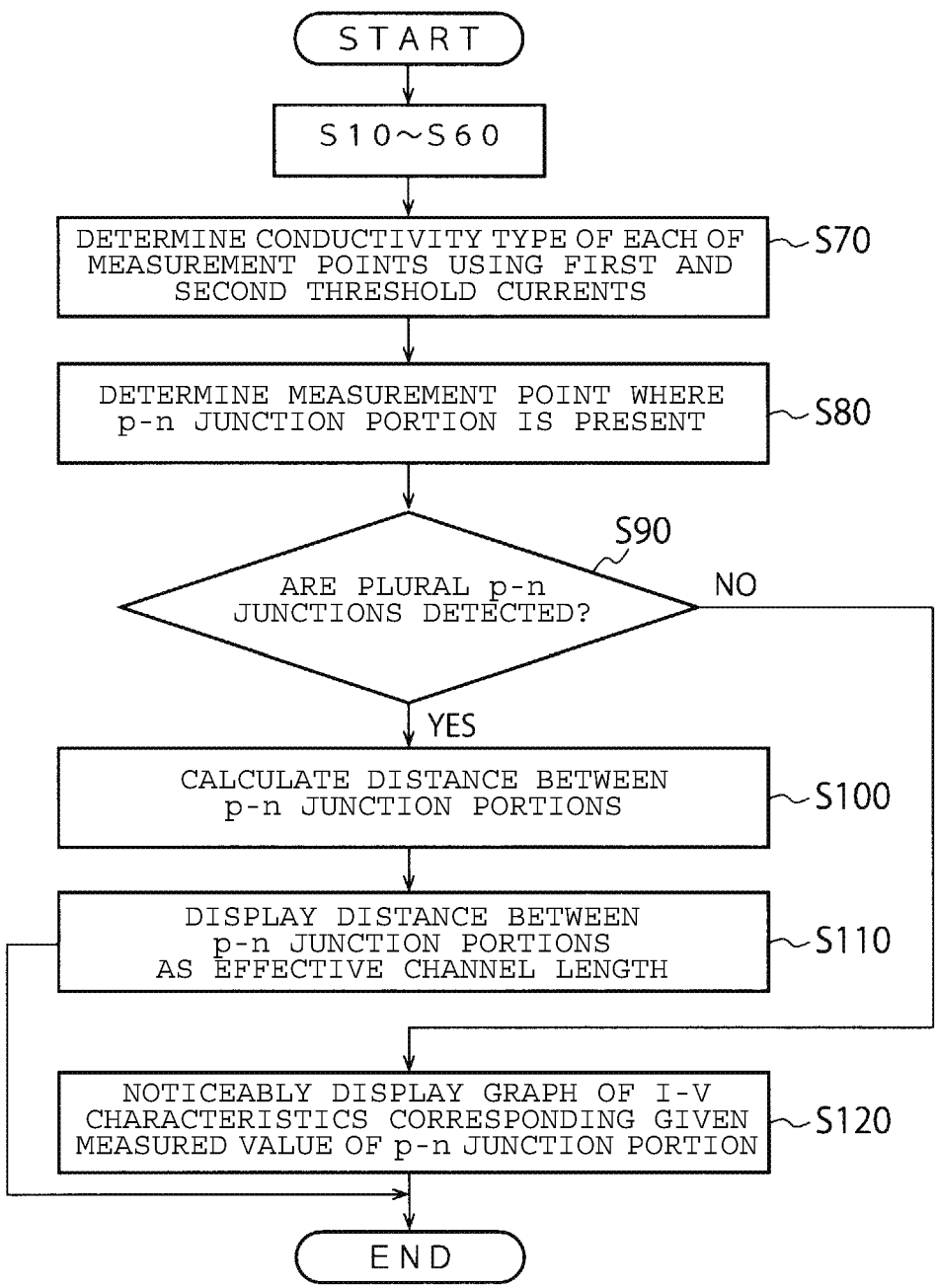
FIG. 11 is a flowchart showing an example of a method of measuring a conductivity type according to a fourth embodiment.

FIG. 11 is a flowchart showing an example of a method of measuring a conductivity type according to the fourth embodiment. First, as in the case of the first embodiment, the device 1 performs Steps S10 to S60 and obtains the I-V characteristics of the measurement points.

Next, the measurement operation portion 60 determines the conductivity type of each of the measurement points using the first and second threshold currents It1 and It2 (S70). For example, as described above, when the negative voltage V is applied to the sample 2, in a case where the current I flowing via the sample 2 is lower than the first threshold current It1 (is higher than the first threshold current It1 on the negative side), the measurement operation portion 60 determines that the conductivity type of the sample 2 at the measurement point is n-type. On the other hand, when the positive voltage V is applied to the sample 2, in a case where the current I flowing via the sample 2 is higher than the second threshold current It2, the measurement operation portion 60 determines that the conductivity type of the sample 2 at the measurement point is p-type.

Next, the measurement operation portion 60 determines a measurement point where a p-n junction portion is present (S80). For example, when the current I is lower than the first and second threshold currents It1 and It2 in terms of absolute values, the measurement operation portion 60 determines that a p-n junction portion is present at the measurement point. Alternatively, the measurement operation portion 60 determines that a p-n junction portion is present between measurement points where the conductivity type changes from n-type to p-type or changes from p-type to n-type.

Next, in a case where plural p-n junctions are detected (YES in S90), the measurement operation portion 60 calculates the distance between the p-n junction portions based on coordinates of the measurement points (S100). The display portion 80 displays not only the graph of the I-V characteristics and the first and second threshold currents It1 and It2 but also the distance between the p-n junction portions as the effective channel length Leff (S110). The display portion 80 noticeably displays the size, color, thickness, or the like of the graph of the I-V characteristics corresponding to a given measured value of the p-n junction portion to be different from those of the other graphs. The display portion 80 may display a coordinate of a give measured value of the p-n junction portion.

In a case where a single p-n junction is detected (NO in S90), the display portion 80 noticeably displays the size, color, thickness, or the like of the graph of the I-V characteristics corresponding to a given measured value of the p-n junction portion to be different from those of the other graphs. Alternatively, the display portion 80 may display a coordinate of a give measured value of the p-n junction portion (S120).

In addition, in order to distinguish a graph of I-V characteristics of an n-type measurement point and a graph of I-V characteristics of a p-type measurement point, the display portion 80 may display the sizes, colors, thicknesses, or the like of the graphs to be different from each other.

As described above, according to the fourth embodiment, the first and second threshold currents It1 and It2 having different polarities may be set in advance. When the current I is lower than the first threshold current It1 of the negative electrode, the measurement operation portion 60 determines that the conductivity type of the measurement point is n-type. When the current I is higher than the second threshold current It2 of the positive electrode, the measurement operation portion 60 determines that the conductivity type of the measurement point is p-type. As a result, the measurement operation portion 60 can automatically determine the conductivity type of the measurement point based on the I-V characteristics. In addition, the measurement operation portion 60 can automatically calculate the position of the p-n junction portion and the effective channel length Leff based on the conductivity type of the measurement point.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor measurement device comprising:
an electrode provided in a semiconductor sample;
a probe contactable with the semiconductor sample;
a driver configured to move a contact position of the probe with respect to the semiconductor sample;
a power supply configured to apply electric power between the probe and the electrode;
a measurement operation portion configured to measure a current flowing via the semiconductor sample between the probe and the electrode as a voltage applied between the probe and the electrode is changed, the measurement operation portion configured to measure the current flowing for each of plural measurement points of a surface of the semiconductor sample while causing the probe to scan the measurement points, or while sequentially bringing the probe into contact with the measurement points;
a display configured to display a relationship between the voltage and the current measured at each of the measurement points,
wherein the electrode is provided on a first side surface of the semiconductor sample, the semiconductor sample having a second side surface opposite to the first side surface, and the probe is contactable with the second side surface to form a direct contact region, where the probe is in electric contact with the semiconductor sample, and an indirect contact region, where the semiconductor sample and the probe are insulated from each other; and
a storage portion that stores a first threshold current and a second threshold current of the current having different polarities, wherein
the display is further configured to display the first threshold current and the second threshold current to be superimposed on the relationship between the voltage and the current.

2. The semiconductor measurement device according to claim 1,
wherein the measurement operation portion is configured to determine, for each measurement point, a conductivity type of the measurement point based on a relationship between the voltage and the current measured at the measurement point.

3. The semiconductor measurement device according to claim 2, wherein the measurement operation portion is configured to determine the location of a p-n junction based on the determined conductivity types of the measurement points.

4. The semiconductor measurement device according to claim 3, wherein in a case where plural p-n junction portions are detected, the measurement operation portion is configured to calculate a distance between the p-n junction portions, and
the display portion is configured to display the distance between the p-n junction portions.

5. The semiconductor measurement device according to claim 1, wherein the power supply is one of a DC power supply or an AC power supply.

6. The semiconductor measurement device according to claim 5, wherein the power supply is an AC power supply, and the measurement operation portion is configured to measure current flowing according to a voltage frequency of the AC power supply.

7. The semiconductor measurement device according to claim 1, wherein
a contact portion of the semiconductor sample with respect to the probe is covered with an insulating film.

8. The semiconductor measurement device according to claim 1, wherein
an impurity of a contact portion of the semiconductor sample with respect to the probe is inactivated.

9. The semiconductor measurement device according to claim 1,
wherein the storage portion stores the first threshold current being of a negative electrode and the second threshold current being of a positive electrode, wherein
the measurement operation portion is configured to: determine a conductivity type of the measurement point as a first conductivity type when the current is lower than the first threshold current, determine a conductivity type of the measurement point as a second conductivity type when the current is higher than the second threshold current, and determine that a p-n junction portion is present at the measurement point when the current is lower than the first threshold current and the second threshold current in terms of absolute values.

10. The semiconductor measurement device according to claim 9, wherein
in a case where plural p-n junction portions are detected, the measurement operation portion is configured to calculate a distance between the p-n junction portions, and
the display is configured to display the distance between the p-n junction portions.

11. A semiconductor measurement device, comprising:
an electrode provided in a semiconductor sample;
a probe contactable with the semiconductor sample;
a driver configured to move a contact position of the probe with respect to the semiconductor sample;
a power supply configured to apply electric power between the probe and the electrode;
a measurement operation portion configured to measure a current flowing via the semiconductor sample between the probe and the electrode as a voltage applied between the probe and the electrode is changed, the measurement operation portion configured to measure the current flowing for each of plural measurement points of a surface of the semiconductor sample while causing the probe to scan the measurement points, or while sequentially bringing the probe into contact with the measurement points;

a display configured to display a relationship between the voltage and the current measured at each of the measurement points, wherein a tip portion of the probe is partially covered with an insulating film; and a storage portion that stores a first threshold current and a second threshold current of the current having different polarities, wherein the display is further configured to display the first threshold current and the second threshold current to be superimposed on the relationship between the voltage and the current.

12. The semiconductor measurement device according to claim 11, wherein a contact portion of the semiconductor sample with respect to the probe is covered with another insulating film.

13. A method of measuring a semiconductor using a semiconductor measurement device, the device including a probe that is contactable with a semiconductor sample, a driver configured to move a contact position of the probe with respect to the semiconductor sample, a power supply configured to apply electric power between the probe and the electrode provided in the semiconductor sample, a measurement operation portion configured to measure a current flowing via the semiconductor sample, and a display configured to display a measurement result of the current, the method comprising:

measuring a current flowing via the semiconductor sample between the probe and the electrode when a voltage applied between the probe and the electrode is changed, the current flowing measured for each of plural measurement points of a surface of the semiconductor sample while causing the probe to scan the measurement points, or while sequentially bringing the probe into contact with the measurement points;

displaying a relationship between the voltage and the current measured at each of the measurement points, wherein a tip portion of the probe is partially covered with an insulating film, and a contact portion of the semiconductor sample with respect to the probe is covered with another insulating film; and storing a first threshold current and a second threshold current of the current having different polarities;

wherein the displaying includes displaying the first threshold current and the second threshold current to be superimposed on the relationship between the voltage and the current.

14. The method of measuring a semiconductor according to claim 13, wherein the probe comes into contact with the semiconductor sample such that a contact region between the semiconductor sample and the probe includes a direct contact region, where the semiconductor sample and the probe are in electric contact with each other, and an indirect contact region, where the semiconductor sample and the probe are electrically insulated from each other.

15. The method of measuring a semiconductor according to claim 13, further comprising:

determining, for each measurement point, a conductivity type of the measurement point based on a relationship between the voltage and the current measured at the measurement point.

16. The method of measuring a semiconductor according to claim 15, further comprising determining the location of a p-n junction based on the determined conductivity types of the measurement points.

17. The method of measuring a semiconductor according to claim 16, further comprising: wherein in a case where plural p-n junction portions are detected, calculating a distance between the p-n junction portions, and displaying the distance between the p-n junction portions.

* * * * *